(12) United States Patent
Chuang et al.

(10) Patent No.: US 8,883,628 B2
(45) Date of Patent: Nov. 11, 2014

(54) ELECTRICAL CONNECTION STRUCTURE

(71) Applicant: Taiwan Semiconductor Manufacturing Company, Ltd., Hsin-Chu (TW)

(72) Inventors: Yao-Chun Chuang, Hsin-Chu (TW); Chang-Chia Huang, Hsin-Chu (TW); Tsung-Shu Lin, New Taipei (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/925,924

(22) Filed: Jun. 25, 2013

(65) Prior Publication Data

US 2013/0288473 A1    Oct. 31, 2013

Related U.S. Application Data

(62) Division of application No. 13/308,249, filed on Nov. 30, 2011, now Pat. No. 8,476,759.

(51) Int. Cl.
*H01L 23/00* (2006.01)
*H01L 23/31* (2006.01)
*H01L 23/29* (2006.01)

(52) U.S. Cl.
CPC ....... *H04L 24/11* (2013.01); *H01L 2224/05572* (2013.01); *H01L 2224/05091* (2013.01); *H01L 2224/1145* (2013.01); *H01L 2224/05005* (2013.01); *H01L 2224/13111* (2013.01); *H01L 2224/13147* (2013.01); *H01L 2224/05124* (2013.01); *H01L 2224/11462* (2013.01); *H04L 2224/03462* (2013.01); *H01L 24/05* (2013.01); *H01L 2224/13022* (2013.01); *H04L 2224/05022* (2013.01); *H01L 2224/05086* (2013.01); *H01L 24/03* (2013.01); *H01L 23/293* (2013.01); *H01L 23/3192* (2013.01); *H01L 24/13* (2013.01); *H01L 2224/05541* (2013.01)
USPC ........... 438/613; 257/734; 257/736; 257/750; 257/758; 257/E23.019; 257/E33.02; 257/E23.021; 257/E21.507; 438/612; 438/614; 438/622; 438/638

(58) Field of Classification Search
CPC ..................... H01L 21/76895; H01L 23/4824; H01L 24/02; H01L 24/10; H01L 2224/116; H01L 2224/32013; H01L 23/3171; H01L 2224/0391; H01L 2224/0401
USPC .................. 257/E21.507, 734, 736, 750, 758, 257/E23.019, E23.02, E23.021; 438/612, 438/613, 614, 622, 638
See application file for complete search history.

(56) References Cited

U.S. PATENT DOCUMENTS

| 2006/0249848 | A1 | 11/2006 | Coolbaugh et al. |
| 2007/0096320 | A1 | 5/2007 | Takemura et al. |
| 2008/0073790 | A1 | 3/2008 | Burrell et al. |
| 2009/0015285 | A1* | 1/2009 | Farooq et al. ................. 324/763 |
| 2010/0301488 | A1* | 12/2010 | Oda et al. ...................... 257/773 |

* cited by examiner

*Primary Examiner* — Peniel M Gumedzoe
(74) *Attorney, Agent, or Firm* — Slater & Matsil, L.L.P.

(57) ABSTRACT

A structure comprises a top metal connector formed underneath a bond pad. The bond pad is enclosed by a first passivation layer and a second passivation layer. A polymer layer is further formed on the second passivation layer. The dimension of an opening in the first passivation layer is less than the dimension of the top metal connector. The dimension of the top metal connector is less than the dimensions of an opening in the second passivation layer and an opening in the polymer layer.

17 Claims, 4 Drawing Sheets

US 8,883,628 B2

ELECTRICAL CONNECTION STRUCTURE

This application is a divisional of U.S. patent application Ser. No. 13/308,249, filed on Nov. 30, 2011, entitled "Electrical Connection Structure," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps. Much higher density can be achieved by employing chip-scale packaging based semiconductor devices. Furthermore, chip-scale packaging based semiconductor devices can achieve smaller form factors, cost-effectiveness, increased performance and lower power consumption.

A chip-scale packaging based semiconductor device may comprise a plurality of solder balls formed on a plurality of under bump metal (UBM) openings of a semiconductor die. Alternatively copper bumps may be employed to electrically connect the semiconductor device with external circuits. There may be a concentration of stress in the areas adjacent to the connection structure of the semiconductor device. For example, an inter-level dielectric layer is located immediately underneath the electrical connection structure. In addition, the inter-level dielectric layer may be formed of an extremely low-k dielectric (ELK) material. As a result, the stress generated by the electrical connection structure may cause the ELK layer to crack or delaminate under stress.

The chip-scale packaging technology has some advantages. One advantageous feature of chip-scale packaging is that chip-scale packaging techniques may reduce fabrication costs. Another advantageous feature of chip-scale packaging based multi-chip semiconductor devices is that parasitic losses are reduced by employing bumps sandwiched between a semiconductor device and a PCB board.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, an electrical connection structure. The disclosure may also be applied, however, to a variety of semiconductor devices.

Figure 1A:
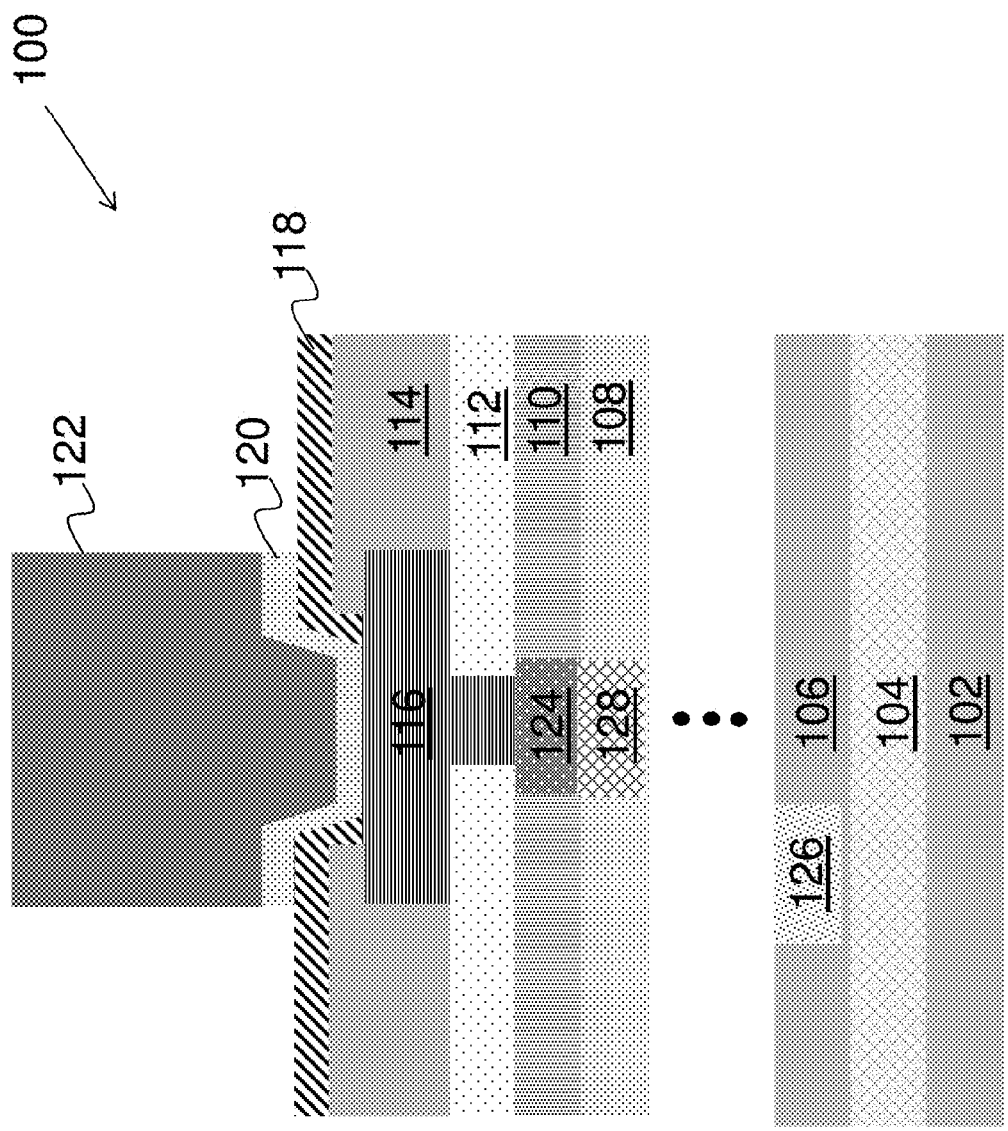
FIG. 1A illustrates a cross sectional view of an electrical connection structure in accordance with an embodiment.

Referring initially to FIG. 1A, a cross sectional view of an electrical connection structure is illustrated in accordance with an embodiment. As shown in FIG. 1A, the electrical connection structure is formed on a semiconductor die 100. The semiconductor die 100 comprises a substrate 102. The substrate 102 may be a silicon substrate. Alternatively, the substrate 102 may be a silicon-on-insulator substrate. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 1A, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 1A shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extremely low-k dielectric material) and conductive materials (e.g., copper).

A dielectric layer 110 is formed on top of the top metallization layer 108. As shown in FIG. 1A, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extremely low-k (ELK) dielectrics such as porous carbon doped silicon dioxide can be employed to form the first passivation layer 112. The first passivation layer 112 may be formed through any suitable techniques such as CVD. As shown in FIG. 1A, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 1A, a bond pad 116 is formed in the openings of the first passivation and second passivation layers. In accordance with an embodiment, the bond pad 116 may be formed of aluminum. For simplicity, throughout the description, the bond pad 116 may be alternatively referred to as an aluminum pad 116.

The aluminum pad 116 may be enclosed by the first and second passivation layers 112 and 114. In particular, a bottom portion of the aluminum pad 116 is embedded in the first passivation layer 112 and a top portion of the aluminum pad 116 is embedded in the second passivation layer 114. The first and second passivation layers 112 and 114 overlap and seal the edges of the aluminum pad 116 so as to improve electrical stability by preventing the edges of the aluminum pad 116 from corrosion. In addition, the passivation layers may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating. A redistribution layer (not shown) may be formed in the semiconductor device 100 if the bond pads are relocated to new locations. The redistribution layer provides a conductive path between the metal lines (e.g., metal line 128) and the redistributed bond pads. The operation principles of redistribution layers are well known in the art, and hence are not discussed in detail herein.

The PI layer 118 is patterned to form a plurality of openings. Furthermore, various under bump metal (UBM) structures (e.g., UBM 120) are formed on top of the openings. The UBM structures (e.g., UBM 120) are employed to connect the aluminum pads (e.g., aluminum pad 116) with various input and output terminals (e.g., connector 122). The UBM structures may be formed by any suitable techniques such as electroplating. Other processes of formation such as sputtering, evaporation, PECVD and the like may alternatively be used depending upon the desired materials.

In accordance with an embodiment, the connector 122 may be a copper bump. The copper bump may be of a height of approximately 45 um. In accordance with an embodiment, a variety of semiconductor packaging technologies such as sputtering, electroplating and photolithography can be employed to form the copper bump. As known in the art, in order to insure the reliable adhesion and electrical continuity between the copper bump and the bond pad 116, additional layers including a barrier layer, an adhesion layer and a seed layer may be formed between the copper bump and the bond pad 116.

Figure 1B:
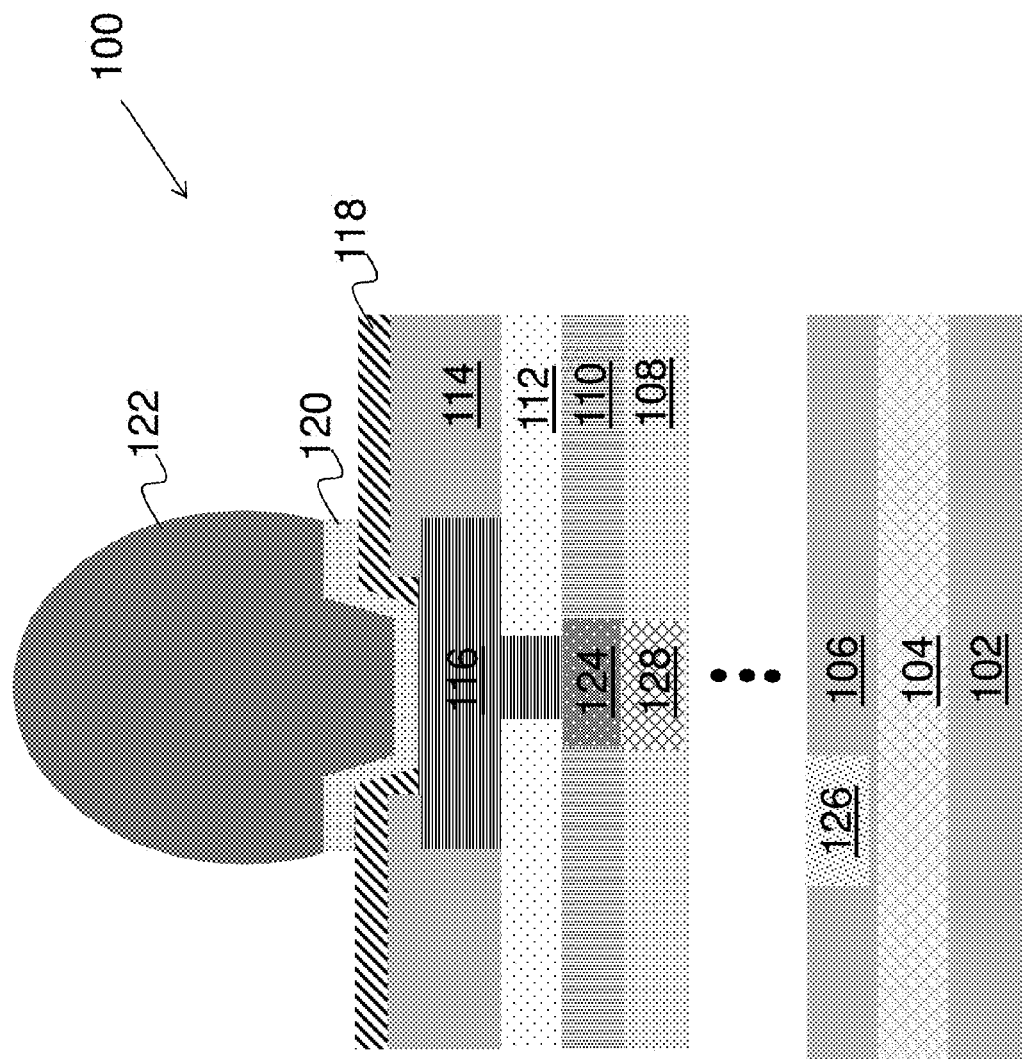
FIG. 1B illustrates a cross sectional view of an electrical connection structure in accordance with another embodiment.

FIG. 1B illustrates a cross sectional view of an electrical connection structure in accordance with another embodiment. The structure of FIG. 1B is similar to FIG. 1A except that the connector 122 is a solder ball. Connector 122 is formed on top of the UBM structure 120. In accordance with an embodiment, the connector 122 is a solder ball. The solder ball 122 may be made of any of suitable materials. In accordance with an embodiment, the solder balls 104 and 106 comprise SAC405. SAC405 comprises 95.5% Sn, 4.0% Ag and 0.5% Cu. It should be noted that the connectors shown in FIG. 1A and FIG. 1B are merely an example. The disclosure is applicable to a variety of semiconductor connectors.

Figure 2:
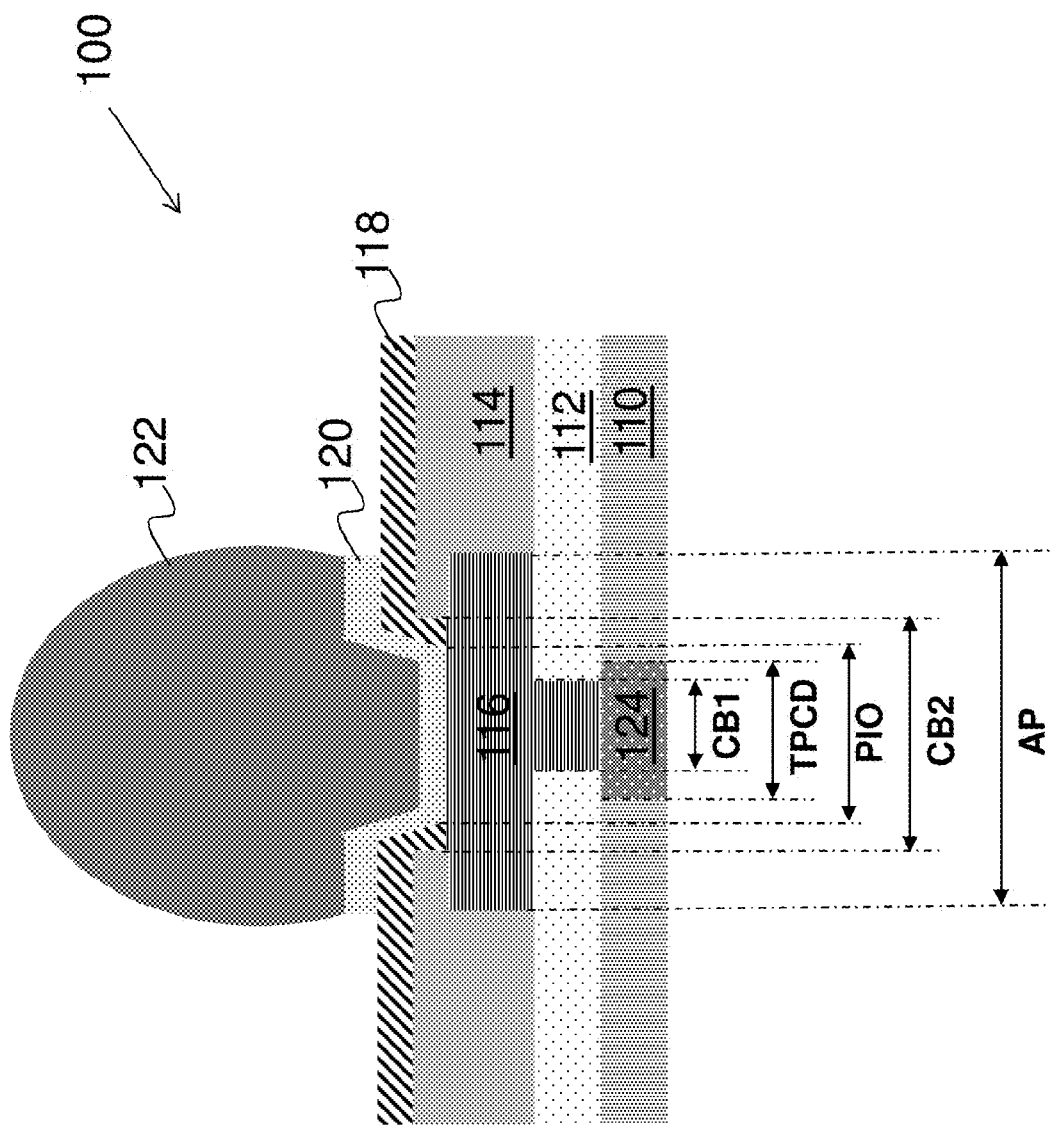
FIG. 2 illustrates a cross sectional view of a portion of a semiconductor device in accordance with an embodiment.

FIG. 2 illustrates a cross sectional view of a portion of a semiconductor device in accordance with an embodiment. As shown in FIG. 2, the dimension of the opening in the first passivation layer 112 is defined as CB1. In other words, the dimension of the bottom portion of the aluminum pad 116 is CB1 because the bottom portion of the aluminum pad 116 is in the opening and fully enclosed by the first passivation layer 112. Likewise, the dimension of the top metal connector 124 is defined as TPCD. In accordance with an embodiment, TPCD is approximately equal to 38 um. The dimension of the opening in the PI layer 118 is defined as PIO. The dimension of the opening in the second passivation layer 114 is defined as CB2. Lastly, the dimension of the top portion of the aluminum pad 116 is defined as AP.

In accordance with an embodiment, in order to reduce the stress on the layers beneath the electrical connection structure, especially the stress on the ELK layers, the dimensions described above are subject to the following restriction:

$$CB1 < TPCD < PIO < CB2 < AP$$

Furthermore, in accordance with an embodiment, the difference between CB1 and TPCD is approximately 4 um. The difference between PIO and TPCD is greater than 2 um. In accordance with an embodiment, the difference between PIO and TPCD is approximately 4 um. Likewise, the difference between PIO and CB2 is approximately 10 um. One advantageous feature of having the restriction shown above is that the dimension restriction helps to reduce the stress on the ELK layers. In addition, the restriction helps to provide a balance between electrical performance and long term reliability.

Figure 3:
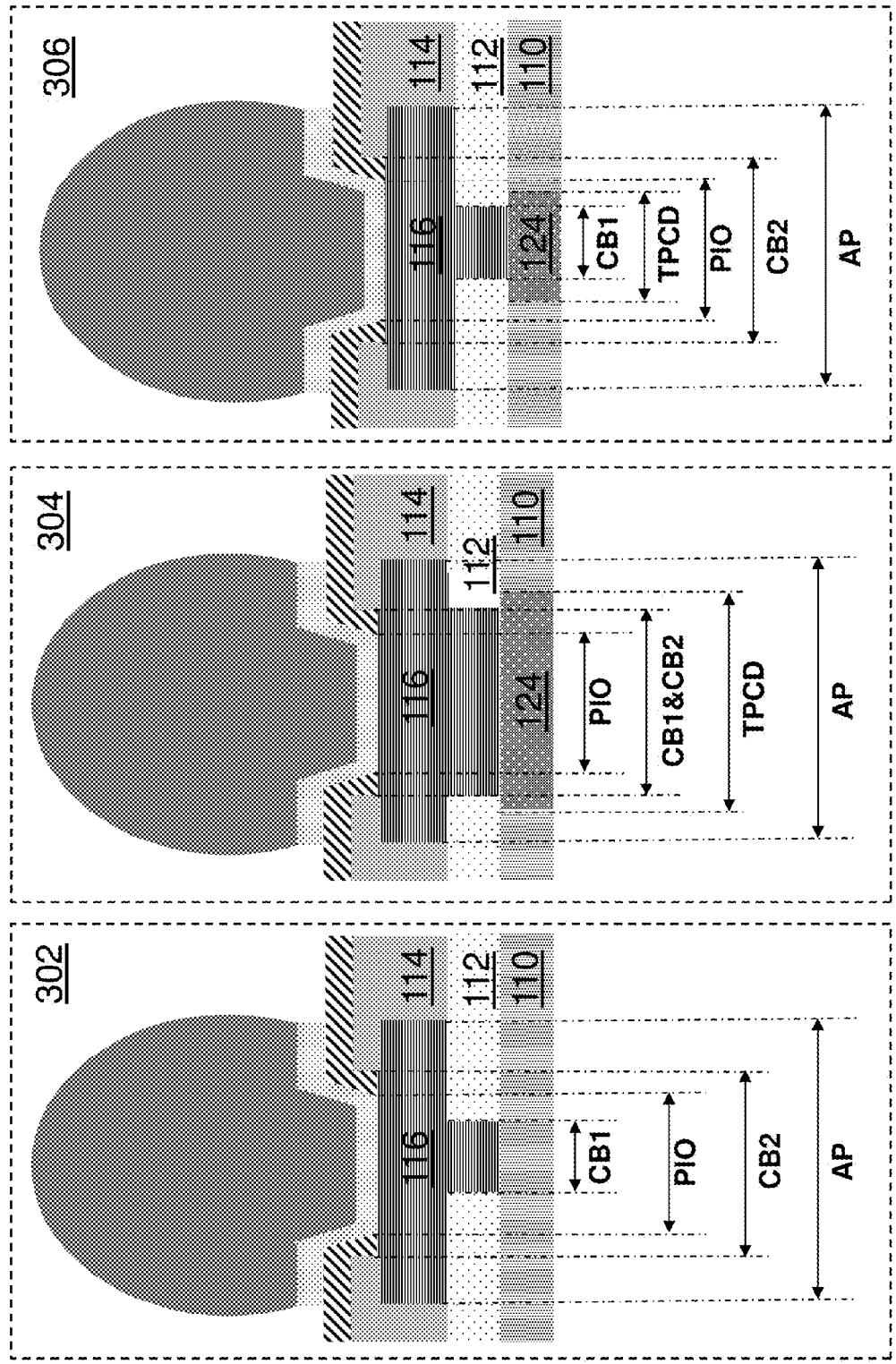
FIG. 3 illustrates cross sectional views of several electrical connection structures.

FIG. 3 illustrates cross sectional views of several electrical connection structures. A first electrical connection structure 302 is similar to the electrical connection structure 100 shown in FIG. 1A except that the first electrical connection structure 302 does not include a top metal connector (e.g., connector 124). The first electrical connection structure 302 may rely on a plurality of via-holes (not shown) to connect the top metal lines (not shown) with the aluminum pad 116.

A second electrical connection structure 304 is similar to the electrical connection structure 100 shown in FIG. 1A except that the second electrical connection structure 304 does not follow the restriction shown above. In accordance with an embodiment, for example, the opening in the first passivation layer 112 is greater than the opening in the PI layer 118. In other words, CB1 is greater than PIO.

A third electrical connection structure 306 is similar to the electrical connection structure 100 shown in FIG. 1A. As shown in FIG. 3, the dimension of the top metal connector in the third electrical connection structure 306 is less than that of the second electrical connection structure 304. In accordance with an embodiment, TPCD of the second electrical connection structure 304 is approximately equal to 59 um. In contrast, TPCD of the third electrical connection structure 306 is approximately equal to 38 um In accordance with an embodiment, a top metal connector (e.g., top metal connector 124) helps to reduce the stress on the ELK layers. Because the first electrical connection structure 302 does not include a top metal connector, the stress distribution on the ELK layers is most uneven for the first electrical connection structure 302. By employing a top metal connector 124, the stress distribution on the ELK layers may be improved in comparison with that the first electrical connection structure 302. However, there may be a few high stress values on the ELK layers. The stress distribution on the ELK layers of the third electrical connection structure 306 is more uniform than that of the second electrical connection structure 304.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
depositing a first passivation layer over a substrate;
forming a first opening with a first dimension in the first passivation layer;
depositing a second passivation layer over the first passivation layer;
forming a second opening with a second dimension in the second passivation layer;
forming a bond pad comprising a horizontal portion with a third dimension and a vertical portion with the first dimension, wherein the third dimension is greater than the second dimension;
depositing a protection layer on the second passivation layer, wherein the protection layer comprises a third opening with a fourth dimension, wherein the second dimension is greater than the fourth dimension; and
forming a top metal connector with a fifth dimension, wherein the top metal connector is formed underneath the bond pad, wherein the fifth dimension is greater than the first dimension, and wherein the second dimension is greater than the fifth dimension.

2. The method of claim 1, wherein:
the fourth dimension is greater than the fifth dimension.

3. The method of claim 2, further comprising:
forming a top portion of the bond pad in the second passivation layer; and
forming a bottom portion of the bond pad in the first passivation layer.

4. The method of claim 3, further comprising:
depositing a dielectric layer over the substrate, wherein:
the dielectric layer is underneath the first passivation layer; and
the top metal connector is embedded in the dielectric layer.

5. A method comprising:
providing a substrate;
forming a first metal layer over the substrate;
depositing a first dielectric layer over the first metal layer;
forming a second metal layer over the first dielectric layer;
depositing a first passivation layer over the second metal layer;
forming a first opening with a first dimension in the first passivation layer;
depositing a second passivation layer over the first passivation layer;
forming a second opening with a second dimension in the second passivation layer;
forming a bond pad with a third dimension in the first passivation layer and the second passivation layer;
depositing a protection layer over the second passivation layer, wherein the protection layer comprises a third opening with a fourth dimension; and
forming a top metal connector with a fifth dimension underneath the bond pad, wherein:
the third dimension is greater than the second dimension;
the second dimension is greater than the fourth dimension;
the fourth dimension is greater than the fifth dimension; and
the fifth dimension is greater than the first dimension.

6. The method of claim 5, further comprising:
depositing a polyimide protection layer over the second passivation layer.

7. The method of claim 5, further comprising:
forming an aluminum bond pad with the third dimension in the first passivation layer and the second passivation layer.

8. The method of claim 7, wherein the aluminum bond pad comprises:
a top portion enclosed by the second passivation layer; and
a bottom portion enclosed by the first passivation layer.

9. The method of claim 5, further comprising:
forming an under bump metallization structure over the bond pad.

10. The method of claim 9, further comprising:
forming the under bump metallization structure through a plasma enhanced chemical vapor deposition process.

11. The method of claim 5, further comprising:
forming an input/output connector over the under bump metallization structure.

12. A method comprising:
forming a first passivation layer over a metal layer;
forming a first opening with a first dimension in the first passivation layer;
forming a second passivation layer over the first passivation layer;
forming a second opening with a second dimension in the second passivation layer;
forming a bond pad with a third dimension, wherein the bond pad is embedded in the first passivation layer and the second passivation layer;
forming a protection layer on the second passivation layer comprising a third opening with a fourth dimension; and
forming a top metal connector with a fifth dimension underneath the bond pad, wherein the third dimension is greater than the second dimension;
the second dimension is greater than the fourth dimension;
the fourth dimension is greater than the fifth dimension; and
the fifth dimension is greater than the first dimension.

13. The method of claim 12, further comprising:
forming a connector on the bond pad.

14. The method of claim 12, further comprising:
forming a conductive channel comprising the connector, the bond pad and the top metal connector.

15. The method of claim 12, further comprising:
forming a top metal connector in a dielectric layer, wherein the dielectric layer is formed over the metal layer.

16. The method of claim 12, further comprising:
forming an under bump metallization structure between the connector and the bond pad.

17. The method of claim 12, further comprising:
forming a plurality of metal lines in the metal layer.

* * * * *